United States Patent [19]

Tanimoto et al.

[11] Patent Number: 4,486,510
[45] Date of Patent: Dec. 4, 1984

[54] METHOD OF MANUFACTURING TUNER CHASSIS

[75] Inventors: Isao Tanimoto, Kakuta; Tsuneo Yamada; Katsuhisa Yamada, both of Soma, all of Japan

[73] Assignee: Alps Electric Co., Ltd., Tokyo, Japan

[21] Appl. No.: 213,651

[22] Filed: Dec. 5, 1980

[30] Foreign Application Priority Data

Jan. 24, 1980 [JP] Japan ............................ 55-7042

[51] Int. Cl.³ .............................................. B05D 3/10
[52] U.S. Cl. .................................... 428/598; 427/240; 427/334; 427/431; 427/433; 427/435; 427/123
[58] Field of Search ............... 427/334, 240, 431, 433, 427/435, 123; 455/347

[56] References Cited

U.S. PATENT DOCUMENTS 2,746,884  5/1956  Rosenkin et al. ................. 427/334
2,800,416  7/1957  Walters ............................ 427/334
3,690,943  9/1972  Papiano ........................... 427/334
3,704,165  11/1972  McLain et al. .................. 427/334

FOREIGN PATENT DOCUMENTS 48-75101  10/1973  Japan .

Primary Examiner—Norman Morgenstern
Assistant Examiner—Janyce A. Bell
Attorney, Agent, or Firm—Guy W. Shoup; Gerard F. Dunne

[57] ABSTRACT

A method of manufacturing a tuner chassis, in which a tuner chassis assembly is entirely dipped in a molten solder bath to effect the plating of the chassis surface with a solder layer, and thereafter the chassis assembly is dipped in an oil bath heated to a temperature higher than the melting temperature of the solder and then raised, whereby the state of solder plating on the chassis surface is improved by making use of the mechanism that oil forms an oil film on the chassis.

8 Claims, 4 Drawing Figures

METHOD OF MANUFACTURING TUNER CHASSIS

BACKGROUND OF THE INVENTION

The present invention relates to a method of manufacturing tuner chassis and, more particularly, to method of manufacturing the chassis for high frequency tuners such as UHF tuners.

The prior-art method of manufacturing high-frequency tuners is as follows. Initially, a chassis housing is formed by bending a material stamped from a steel plate. Also, shield plates for partitioning the interior of the housing into a plurality of cavities are stamped from a steel plate. These component parts are assembled to obtain an eventual chassis. The surface of this eventual chassis is then electroplated with copper and then with tin. In the high-frequency tuner, it is usually desired that the individual cavities defined by shield plates be perfectly shielded with respect to one another. In order to obtain perfect shielding, it has been the practice to braze the abutting portions of the shield plates and housing with copper. This is carried out by putting the chassis assembly together with copper pieces placed adjacent to the abutting portions into a high temperature heating furnace. The heating temperature of the furnace is set to about 1,000° C., at which temperature the copper pieces are fused to join together the abutting portions.

In the above prior-art method of manufacture, however, a long processing time is required due to the heating process in the high temperature heating furnace. In addition, perfect sealing of the abutting protions cannot be obtained in practice even with the above brazing process, and leakage of high frequencies are prone to occur. Further, since the assembly is plated with tin, "wiskers" of tin are liable to result, giving rise to an accident of shorting between circuits.

SUMMARY OF THE INVENTION

A primary object of the present invention is to provide a method of tuner chassis manufacture, with which the manufacturing time required can be reduced.

Another object of the present invention is to provide a method of tuner chassis manufacture, with which it is possible to obtain perfect shielding of the tuner chassis housing cavities from one another.

A further object of the present invention is to provide a method of tuner chassis manufacture, which eliminates generation of whiskers as mentioned above on the chassis surface.

A still further object of the present invention is to provide a method of tuner chassis manufacture, with which the abutting portions of the housing and shield plates within the tuner chassis can be reliably sealed.

To achieve the above objectives, according to the invention, the electroplating as in the prior art is not performed, and after the plating of an eventual chassis surface with a solder layer by entirely dipping it in a molten solder bath, and thereafter dipping it in a heated oil bath and then raised, the plating solder is permitted to be uniformly coated on the chassis surface and is concentrated to a greater thickness in portions of the chassis where the housing and shields are joined together by making use of the fact that the oil forms an oil film on the chassis surface.

The above and other objects, and advantageous features of the present invention will become more apparent from the following detailed description of the preferred embodiments thereof when taking in conjunction with the accompanying drawings.

DESCRIPTION OF THE PREFERRED EMBODIMENTS

Now, the method of the tuner chassis manufacture according to the invention will be described with reference to the accompanying drawings. In the first step, a housing 2 of the tuner chassis 1 is formed by bending a material stamped from a steel plate, and also shield plates 3 for forming a plurality of cavities within the housing 2 are stamped from a steel plate (This step is referred to as component processing step A).

Then, the component parts are dipped in, for instance, trichloroethylene for removing any oil attached thereto (This step is referred to as oil removing step B).

Figure 4:
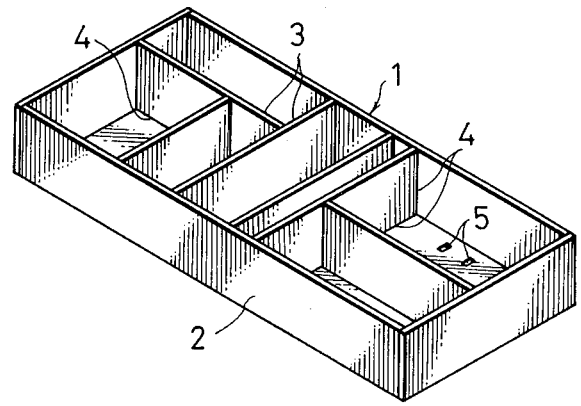
FIG. 4 is a perspective view showing the tuner chassis assembly.

After the removal of oil, the shield plates 3 are assembled in the housing 2 to obtain a tuner chassis assembly as shown in FIG. 4. Although not shown in the figure, a plurality of convexes for holding the shield plates 3 in predetermined positions are formed by means of a press on the inner wall of the housing 2 (This step is referred to as chassis assembling step C).

The chassis assembly 1 thus obtained is then coated with solder flux for ensuring sufficient plating of solder (This step is referred to as flux coating step D).

Figure 1:
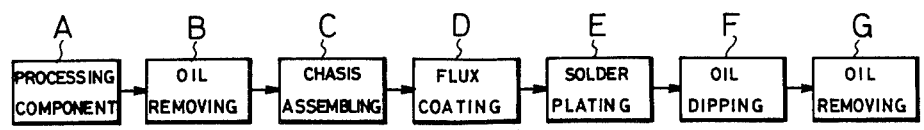
FIG. 1 is a flow chart representing the steps of the method of the tuner chassis manufacture according to the present invention.
Figure 2:
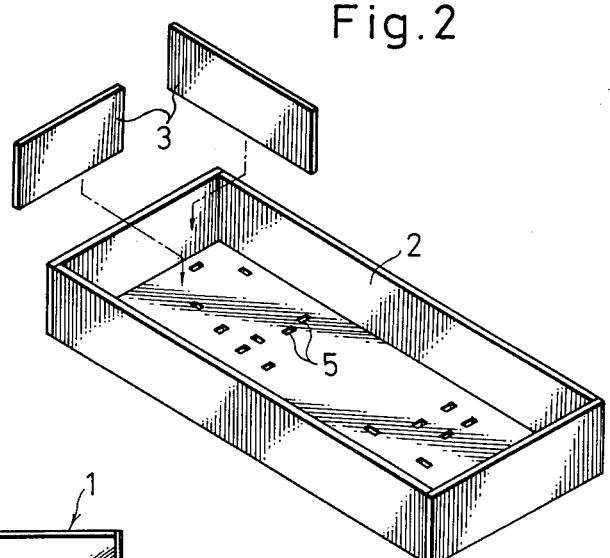
FIG. 2 is an exploded perspective view showing component parts of the tuner chassis before the assembling thereof.
Figure 3:
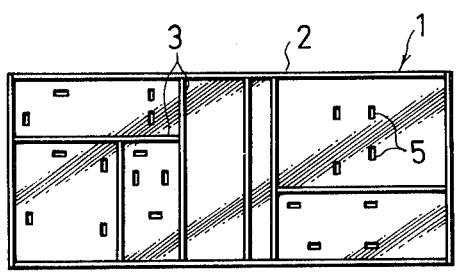
FIG. 3 is a top view showing the tuner chassis assembly.

Subsequently, the chassis assembly 1 is entirely dipped in a molten solder bath and then raised therefrom. In this way, the surface of the chassis assembly 1 can be plated with solder to a thickness of 5 to 8 microns. At this time, the abutting portions of the shield plates 3 and housing 2 are provided solder plating owing to the capillarity of the solder (This step is referred to as solder plating step E). The chassis assembly provided with the solder plating is then brought into a centrifugal separator for processing before the solder is solidified (This step is referred to as centrifugal separation step). As shown in FIG. 2, the housing 2 is formed with a number of holes 5 for installing terminals and electronic parts in an electronic circuit. Thus, with the chassis assembly immediately after the solder plating step, solder may fill and close the holes 5. The centrifugal separation step is effected for removing any solder filling the holes 5. This step is not necessary in case where the chassis assembly has no such hole as the holes 5.

Afterwards, the chassis assembly 1 provided with the solder plating is dipped in an oil bath heated to such an extent that the solder is fused, and is then raised from the bath. Where the solder, with which the chassis assembly 1 is plated, is fused at a temperature of, for instance, 240° C., the oil in the oil bath is heated at least to 240° C. The oil used is preferably palm oil. By raising the chassis assembly 1, the heated oil on flat wall surface portions of the housing 2 is pulled toward the portions thereof joined to the shield plates 3, so that an oil film is formed thereover. As the oil film is formed, the solder in the fused state follows the movement of the oil. The central wall surface portions of the housing 2 or cavities are plated with solder to smoothly a uniform thickness, while in the neighborhood of the portions where the housing 2 and shield plates 3 joined together solder is concentrated to a greater extent owing to the capillarity of solder to promote the reliability of the sealing of the joint portions (This step is referred to as oil dipping step F).

The chassis assembly 1 after the oil dipping step is then left for natural cooling or forcibly cooled down. Finally, the chassis assembly 1 is subjected to an oil removing step G like the afore-mentioned oil removing step B, thus completing a tuner chassis provided with the solder plating.

What is claimed is:

1. A method of manufacturing a tuner chassis having concentrations of solder in joints thereof, comprising the steps of:
   assembling shield plates in a housing to obtain a chassis assembly;
   dipping said chassis assembly in a molten solder bath for providing the surfaces of said chassis assembly with solder plating;
   dipping said chassis assembly provided with said solder plating in a bath of oil heated to a temperature at least as high as the melting temperature of said solder and then raising said chassis assembly from said bath of oil to cause solder to flow towards joints of said chassis assembly; and removing oil from said chassis assembly after cooling thereof.

2. A method of manufacturing a tuner chassis according to claim 1, which further comprises a step of removing unnecessary solder after said step of dipping in solder and before said step of dipping in oil.

3. A method of manufacturing a tuner chassis according to claim 2 in which said step of removing solder is carried out in a centrifugal separator when the solder is in the fused state immediately after said step of dipping in solder.

4. A method of manufacturing a tuner chassis according to claim 1 in which said oil is palm oil.

5. A tuner chassis having concentrations of solder in joints thereof, comprising a chassis assembly comprised of a housing subdivided by shield plates, wherein said chassis assembly is plated by dipping it in a molten solder bath, later dipping said chassis assembly provided with said solder plating in a bath of oil heated to a temperature at least as high as the melting temperature of said solder; and then raising said chassis assembly from said bath of oil to cause solder to flow towards joints of said chassis assembly, and thereafter removing oil from said chassis assembly after cooling thereof.

6. A tuner chassis according to claim 5, wherein unnecessary solder is removed from said chassis assembly after said dipping in solder and before said dipping in oil.

7. A tuner chassis according to claim 6 in which said unnecessary solder is removed in a centrifugal separator immediately after said step of dipping in solder.

8. A tuner chassis according to claim 5, in which said oil is palm oil.

* * * * *